United States Patent
Parimi et al.

(10) Patent No.: US 11,495,483 B2
(45) Date of Patent: Nov. 8, 2022

(54) BACKSIDE GAS LEAKBY FOR BEVEL DEPOSITION REDUCTION

(71) Applicant: Applied Materials, Inc., Santa Clara, CA (US)

(72) Inventors: Venkata Sharat Chandra Parimi, Sunnyvale, CA (US); Diwakar Kedlaya, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 85 days.

(21) Appl. No.: 17/071,595

(22) Filed: Oct. 15, 2020

(65) Prior Publication Data

US 2022/0122870 A1 Apr. 21, 2022

(51) Int. Cl.
*H01L 21/683* (2006.01)
*H01L 21/67* (2006.01)

(52) U.S. Cl.
CPC .... *H01L 21/6833* (2013.01); *H01L 21/67023* (2013.01)

(58) Field of Classification Search
CPC .............. H01L 21/6833; H01L 21/67023
See application file for complete search history.

(56) References Cited

U.S. PATENT DOCUMENTS

| | | | |
|---|---|---|---|
| 6,506,291 B2 * | 1/2003 | Tsai | C30B 31/14 118/724 |
| 2003/0168174 A1 | 9/2003 | Foree | |
| 2009/0097184 A1 * | 4/2009 | Buchberger, Jr. | H01L 21/67109 361/234 |
| 2016/0079057 A1 * | 3/2016 | Varadarajan | H01L 21/02274 438/785 |
| 2016/0336213 A1 | 11/2016 | Gomm et al. | |
| 2019/0035646 A1 | 1/2019 | Nasman et al. | |
| 2020/0312696 A1 * | 10/2020 | Unno | H01L 21/67103 |

FOREIGN PATENT DOCUMENTS

| | | |
|---|---|---|
| CN | 102498558 A | 6/2012 |
| JP | 2020-068350 A | 4/2020 |

OTHER PUBLICATIONS

International Search Report and Written Opinion dated Feb. 7, 2022 in International Patent Application No. PCT/US2021/071882, 8 pages.

* cited by examiner

*Primary Examiner* — Scott Bauer
(74) *Attorney, Agent, or Firm* — Kilpatrick Townsend & Stockton LLP (57) ABSTRACT

Exemplary substrate support assemblies include an electrostatic chuck body defining a substrate platform. The substrate platform may be characterized by an upper surface. The platform may define a purge aperture. The platform may include a plurality of mesas that are disposed in an inner region of the upper surface. Each of the mesas may protrude upward from the upper surface. The platform may include a sealing band that extends upward from the upper surface in a circumferential pattern and partially encircles the inner region of the upper surface. Top surfaces of the mesas and sealing band may form a support surface for a substrate. The sealing band may define a number of gaps. The assemblies may include a support stem coupled with the electrostatic chuck body, a heater embedded within the electrostatic chuck body, and a backside gas source that is coupled with the purge aperture of the support surface.

20 Claims, 7 Drawing Sheets

BACKSIDE GAS LEAKBY FOR BEVEL DEPOSITION REDUCTION

TECHNICAL FIELD

The present technology relates to components and apparatuses for semiconductor manufacturing. More specifically, the present technology relates to substrate support assemblies and other semiconductor processing equipment.

BACKGROUND

Integrated circuits are made possible by processes which produce intricately patterned material layers on substrate surfaces. Producing patterned material on a substrate requires controlled methods for forming and removing material. Chamber components often deliver processing gases to a substrate for depositing films or removing materials. The discontinuity of a wafer edge may result in the deposition on a bevel of the wafer, which may have a large impact on yield as the far edge film thickness variation affects a large number of device dies at the wafer edge.

Thus, there is a need for improved systems and methods that can be used to produce high quality devices and structures. These and other needs are addressed by the present technology.

SUMMARY

Exemplary substrate support assemblies may include an electrostatic chuck body defining a substrate platform. The substrate platform may be characterized by an upper surface. The substrate platform may define a purge aperture. The substrate platform may include plurality of mesas that are disposed in an inner region of the upper surface. Each of the plurality of mesas may protrude upward from the upper surface. The substrate platform may include a sealing band that extends upward from the upper surface in a circumferential pattern and partially encircles the inner region of the upper surface. Top surfaces of the plurality of mesas and the sealing band may form a support surface for a substrate. The sealing band may define a number of gaps. The substrate support assemblies may include a support stem coupled with the electrostatic chuck body. The substrate support assemblies may include a heater embedded within the electrostatic chuck body. The substrate support assemblies may include a backside gas source that is coupled with the purge aperture of the support surface.

In some embodiments, the top surfaces of the plurality of mesas and the sealing band may be the same height. The gaps may be provided at regular angular intervals about the sealing band. The support stem may define a fluid lumen that extends between and couples the backside gas source and the aperture. The plurality of mesas may be uniformly arranged about the inner region of the upper surface. The sealing band may be positioned on the substrate platform so as to define a support seat for an outer periphery of a substrate. A portion of the sealing band and a portion of each gap may extend radially outward from an outermost edge of the support seat. The sealing band may be characterized by a generally circular shape that is interrupted by the number of gaps. The sealing band may be characterized by a plurality of protruding segments that define a support seat for an outer periphery of a substrate. Adjacent pairs of the plurality of protruding segments may be separated by a respective one of the number of gaps. A size of each of the plurality of segments and a size of each of the number of gaps may be substantially equal. The backside gas source may deliver a reactive purge gas. The reactive purge gas may be $O_2$.

Some embodiments of the present technology may encompass substrate support assemblies. The substrate support assemblies may include an electrostatic chuck body defining a substrate platform. The substrate platform may be characterized by an upper surface. The substrate platform may define a single purge aperture. The substrate platform may include a plurality of mesas that are disposed in an inner region of the upper surface. Each of the plurality of mesas may protrude upward from the upper surface. The substrate platform may include a sealing band that extends upward from the upper surface in a circumferential pattern and partially encircles the inner region of the upper surface. The sealing band may be characterized by a plurality of protruding segments that define a support seat for an outer periphery of a substrate. Adjacent pairs of the plurality of protruding segments may be separated by one of a plurality of gaps. The substrate support assemblies may include a support stem coupled with the electrostatic chuck body. The substrate support assemblies may include a backside gas source that is coupled with the purge aperture of the support surface.

In some embodiments the gaps may be provided at regular angular intervals about the sealing band. The support stem may define a fluid lumen that extends between and couples the backside gas source and the aperture. The plurality of mesas may be uniformly arranged about the inner region of the upper surface. The backside gas source may deliver a reactive purge gas. A size of each of the plurality of segments and a size of each of the plurality of gaps may be substantially equal.

Some embodiments of the present technology may encompass methods of processing a semiconductor substrate. The methods may include clamping a semiconductor substrate to a support surface of a substrate platform using a chucking voltage. The substrate platform may be characterized by an upper surface and may define a single purge aperture. The substrate platform may include a plurality of mesas that are disposed in an inner region of the upper surface. Each of the plurality of mesas may protrude upward from the upper surface. The substrate platform may include a sealing band that extends upward from the upper surface in a circumferential pattern and partially encircles the inner region of the upper surface. The support surface may be formed from top surfaces of the plurality of mesas and the sealing band. The sealing band may define a number of gaps separating a number of protruding segments. The methods may include flowing a reactive purge gas to an underside of the semiconductor substrate and through the number of gaps. The reactive purge gas may be $O_2$. At least a portion of each gap and each protruding segment of the sealing band may extend outward beyond an outer periphery of the semiconductor substrate.

Such technology may provide numerous benefits over conventional systems and techniques. For example, embodiments of the present technology may provide substrate support assemblies that may reduce deposition at the bevel relative to conventional technologies, while still providing sufficient chucking force. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION OF THE INVENTION

Wafer bevel film management is a critical aspect of hardmask film deposition, as this affects the downstream processes as poor quality film leads to defects that eventually fall onto the wafer and may lead to device failure. Another aspect of bevel management is the far-edge film thickness. Typically, the discontinuity of the wafer edge results in a drastic change of the film thickness at the bevel as compared to the bulk film. This creates difficulties in subsequent etch steps and in uniformity of further layers deposited on top of the film. This has a significant impact on yield as the far edge film thickness variation affects a large number of device dies at the wafer edge as the area increases proportionally with the square of the radius.

Conventional systems may manage bevel thickness by utilizing shadow rings that physically shield the edge of the wafer and the bevel film from deposition. While shadow rings are quite effective at reducing bevel deposition thickness, the rings result in an increase in in-plane distortion (IPD), as well as have impacts on overlay and are highly sensitive to wafer positioning. Some conventional systems may manage bevel thickness by optimizing the heater pocket to create a plasma shadowing effect. However, while the optimization of the heater pocket has a lesser impact on IPD than shadow rings, this option is less effective at reducing bevel film thickness. Other conventional systems may attempt to manage bevel thickness through the use of a bevel purge in which a separate protective gas is channeled through the pedestal heater and flown across the bevel of the wafer to shield the bevel from deposition gases. This is a targeted approach to prevent deposition gases from reaching the wafer bevel. Thus, the film deposition can be targeted and tuned by flow rate. However, conventional bevel purge techniques require a reduction in the electrostatic chuck mesh size, which leads to reduced chucking force. The reduction of mesh size is caused by the gas channels required for the bevel purge. When the hardmask is applied on substrates characterized by stacks of films, such as 3D NAND ON stacks, the incoming wafer bow increases node to node, which severely limits the practicality of any solution that negatively affects chucking performance. Another conventional approach to manage bevel thickness is to post-etch the bevel only. However, this approach adds an additional processing step and requires an additional chamber. Moreover, in cases where hard to etch hardmask films are used, the bevel etch approach is very difficult.

The present technology overcomes these challenges with substrate support assemblies having particular materials and configurations exhibiting specific physical characteristics that may reduce deposition at the bevel relative to conventional technologies. In particular, the present technology incorporates features of a bevel purge with a flat heater to reduce IPD and bevel deposition, while still providing sufficient chucking force.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include pedestals according to embodiments of the present technology before additional variations and adjustments to this system according to embodiments of the present technology are described.

Figure 1:
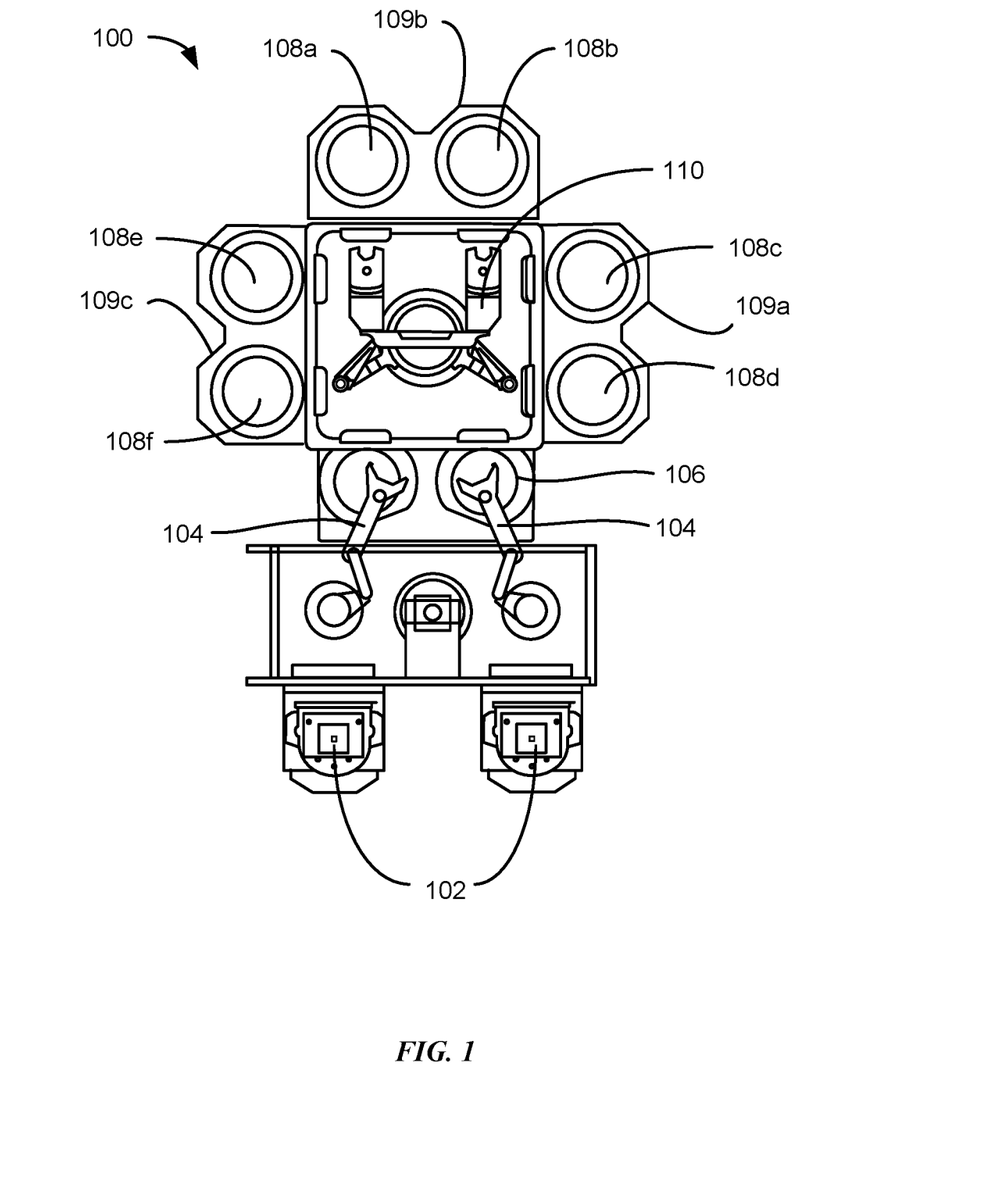
FIG. 1 shows a top plan view of an exemplary processing system according to some embodiments of the present technology.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
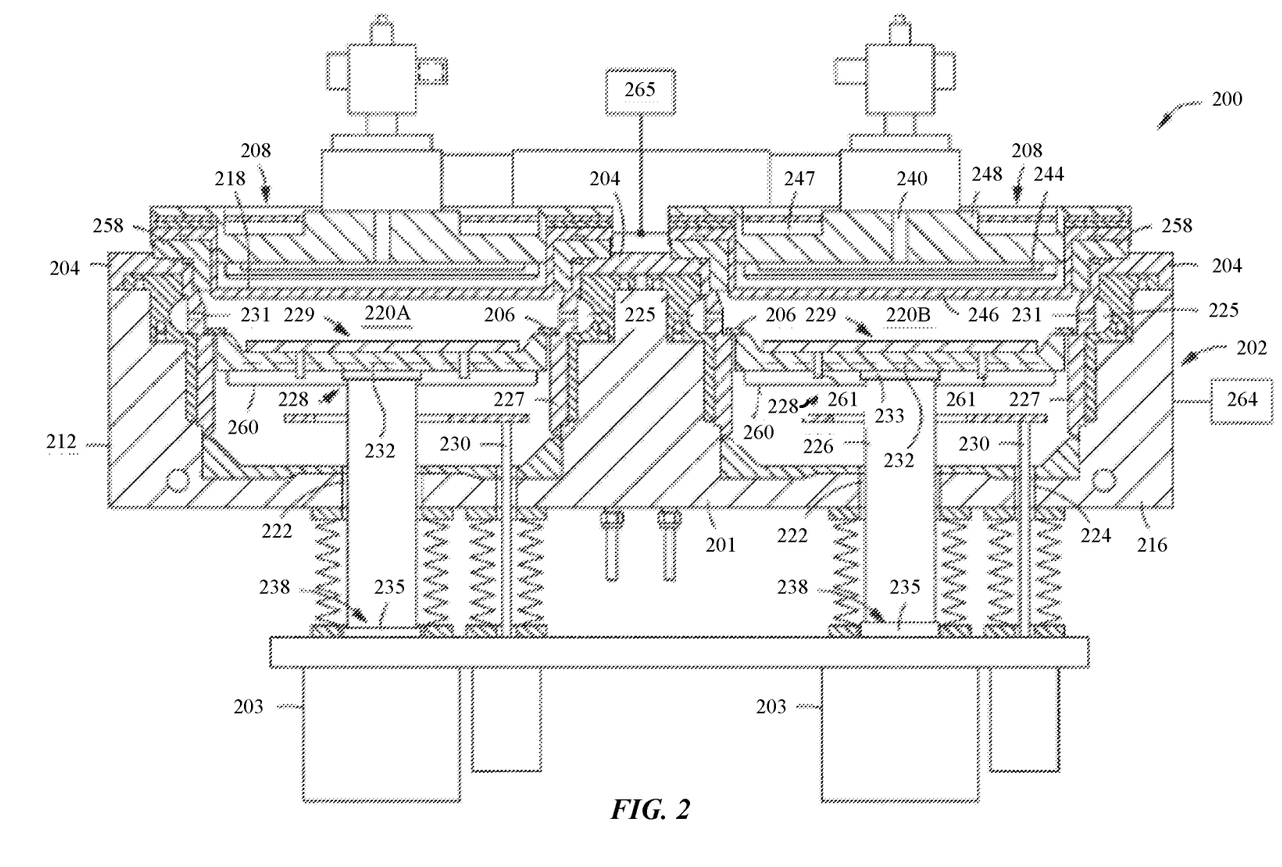
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include substrate support assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the gas distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
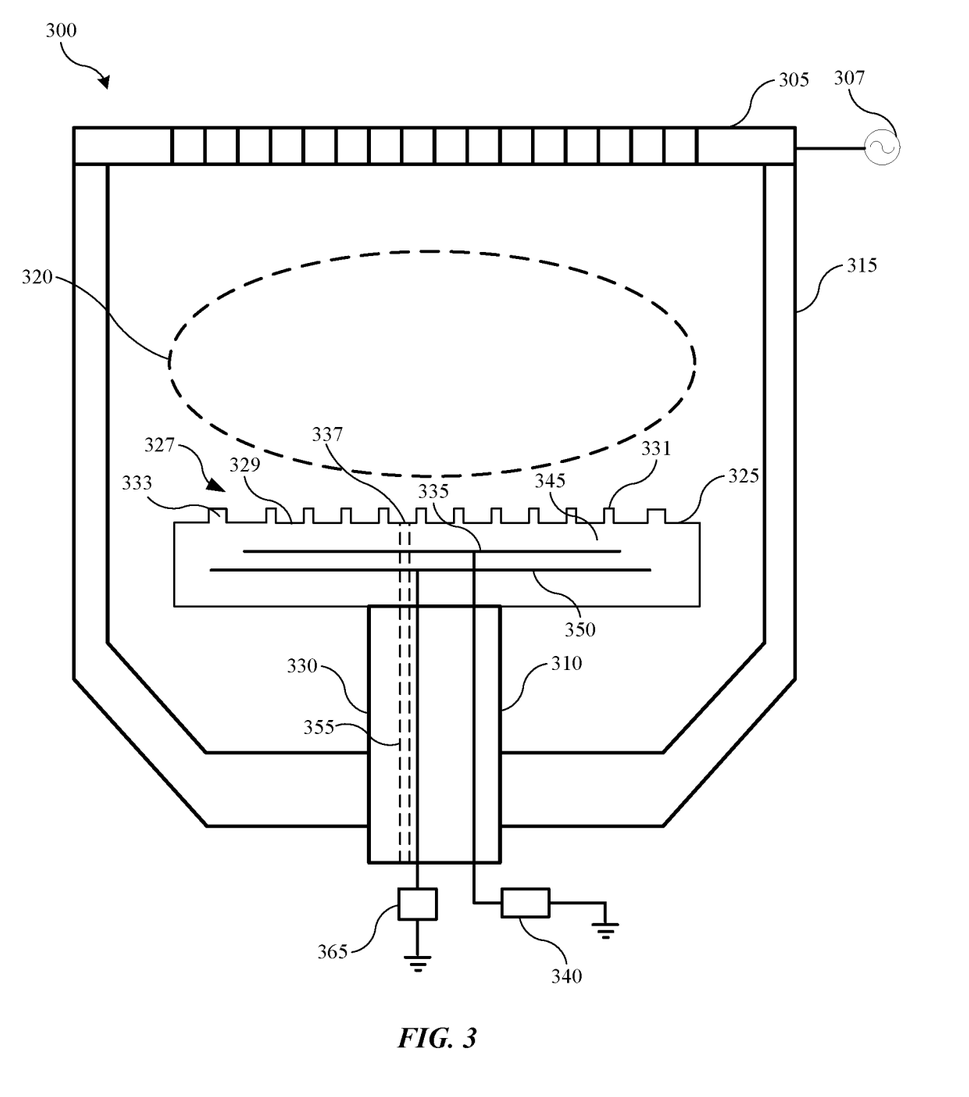
FIG. 3 shows a schematic partial cross-sectional view of an exemplary substrate support assembly according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber. The chamber 300 may be used to perform semiconductor processing operations including deposition of stacks of dielectric materials as previously described. Chamber 300 may show a partial view of a processing region of a semiconductor processing system, and may not include all of the components, such as additional lid stack components previously described, which are understood to be incorporated in some embodiments of chamber 300.

As noted, FIG. 3 may illustrate a portion of a processing chamber 300. The chamber 300 may include a showerhead 305, as well as a substrate support assembly 310. Along with chamber sidewalls 315, the showerhead 305 and the substrate support 310 may define a substrate processing region 320 in which plasma may be generated. The substrate support assembly may include an electrostatic chuck body 325, which may include one or more components embedded or disposed within the body. The components incorporated within the top puck may not be exposed to processing materials in some embodiments, and may be fully retained within the chuck body 325. Electrostatic chuck body 325 may define a substrate platform 327 having an upper surface 329, and may be characterized by a thickness and length or diameter depending on the specific geometry of the chuck body 325. In some embodiments the chuck body may be elliptical, and may be characterized by one or more radial dimensions from a central axis through the chuck body 325. It is to be understood that the top puck may be any geometry, and when radial dimensions are discussed, they may define any length from a central position of the chuck body 325. The substrate platform 327 may define a purge aperture 337 within an inner region of the substrate platform 327.

The substrate platform 327 may include a number of mesas 331 or protrusions that are disposed within and protrude upward from the inner region of the upper surface 329. The mesas 331 may be provided at regular and/or irregular intervals about a face of the substrate platform 327 and may be used to support an underside of a substrate at various locations. A sealing band 333 may be provided that extends upward from the upper surface 325 in a generally circumferential or peripheral pattern (depending on the shape of the top puck). The sealing band 333 may be positioned outward of the inner region and the mesas 331. The sealing band 333 may define a number of gaps that may serve as leak by channels for a gas underneath the substrate to flow outward beyond the bevel of the substrate. A top surface of the sealing band 333 may be at a same height as a top surface of each of the mesas 331. This enables a substrate to be supported by both the mesas 331 and the sealing band 333, with the bevel of the substrate being supported by a portion of the sealing band 333.

While illustrated with corners of the mesas 331 and sealing band 333 being square, it will be appreciated that in some embodiments, an amount of rounding may be provided to the corners of the mesas 331 and/or sealing band 333. This may reduce or limit the sharp contact between the edge of mesas 331 and/or sealing band 333 and the substrate. By providing a rounded corner on mesas 331 and/or sealing band 333, an edge interaction with the substrate may be reduced when a substrate begins deflecting, which may reduce or limit scratching on the backside of the substrate. In some embodiments an additional polishing operation may be performed during formation of the mesas 331 and/or sealing band 333, which may provide both a smoother contact surface, as well as rounded corners extending radially about each protrusion. The additional polishing may include any number of polishing operations, which may include a mechanical soft polish, a chemical polish, a laser ablation or reduction, or any other ways by which a rounded profile may be produced.

In some embodiments mesas 331 and/or sealing band 333 may be developed to a greater height acknowledging that the additional polishing operation may reduce the height of the protrusions to a target level. For example, along with providing a rounded corner, the polishing operation may reduce the height of the mesas 331 and/or sealing band 333 by less than or about 10 μm in some embodiments. Additionally, the polishing may reduce a surface roughness of the top surfaces of the mesas 331 and/or sealing band 333. For example, in some embodiments the average roughness across the top surfaces of the mesas 331 and/or sealing band 333 may be less than or about 1.00 μm, and may be less than or about 0.95 μm, less than or about 0.90 μm, less than or about 0.85 μm, less than or about 0.80 μm, less than or about 0.75 μm, less than or about 0.70 μm, less than or about 0.65 μm, less than or about 0.60 μm, less than or about 0.55 μm, less than or about 0.50 μm, less than or about 0.45 μm, less than or about 0.40 μm, or less in some embodiments.

The additional polishing may produce an edge blend creating a rounded corner extending radially about the mesas 331 and/or sealing band 333. Because the substrate may deflect about the mesas 331 and/or sealing band 333 in all directions, a consistent rounding may facilitate a reduction in edge contact between the mesas 331 and/or sealing band 333 and the substrate. The amount of rounding may vary depending on any number of characteristics of the protrusions or substrate support, although in some embodiments the corner radius may be less than or about 30% of a height of the protrusion, and may be less than or about 25% of the height, less than or about 20% of the height, less than or about 18% of the height, less than or about 15% of the height, less than or about 14% of the height, less than or about 13% of the height, less than or about 12% of the height, less than or about 11% of the height, less than or about 10% of the height, less than or about 9% of the height, or less, although in some embodiments the corner radius may be greater than or about 5% to ensure a reduced edge of the mesas 331 and/or sealing band 333 are contacting the substrate.

For example, for a 30 μm tall mesa 331, the corner radius may be less than or about 10 μm, and may be less than or about 9 μm, less than or about 8 μm, less than or about 7 μm, less than or about 6 μm, less than or about 5 μm, less than or about 4 μm, less than or about 3 μm, less than or about 2 μm, or less, although in some embodiments the corner radius may be greater than or about 3 μm to ensure sufficient rounding to limit edge contact. It is to be understood that mesas 331 and/or sealing band 333 encompassed by embodiments of the present technology may be characterized by any other height or diameter as discussed previously. By providing substrate support assemblies characterized by reduced grain sizes and/or mesas 331 and/or sealing band 333 characterized by a rounded edge profile, the present technology may afford reduced backside damage on processed substrates, which may limit fall-on particles and lithography defocus, as well as improve device yield.

Electrostatic chuck body 325 may be coupled with a stem 330, which may support the chuck body 325 and may include channels as will be discussed below for delivering and receiving electrical and/or fluid lines that may couple with internal components of the chuck body 325. Chuck body 325 may include associated channels or components to operate as an electrostatic chuck, although in some embodiments the assembly may operate as or include components for a vacuum chuck, or any other type of chucking system. Stem 330 may be coupled with the chuck body on a second surface of the chuck body opposite the substrate support surface. The electrostatic chuck body 325 may include an electrode 335, which may be a DC electrode, embedded within the chuck body proximate the substrate support surface. Electrode 335 may be electrically coupled with a power source 340. Power source 340 may be configured to provide energy or voltage to the electrically conductive chuck electrode 335. This may be operated to form a plasma of a precursor within the processing region 320 of the semiconductor processing chamber 300, although other plasma operations may similarly be sustained. For example, electrode 335 may also be a chucking mesh that operates as electrical ground for a capacitive plasma system including an RF source 307 electrically coupled with showerhead 305. For example, electrode 335 may operate as a ground path for RF power from the RF source 307, while also operating as an electric bias to the substrate to provide electrostatic clamping of the substrate to the substrate platform 327. Power source 340 may include a filter, a power supply, and a number of other electrical components configured to provide a chucking voltage.

The stem 330 may define a gas lumen 355 that runs along at least a portion of the length of the stem 330. A top end of the gas lumen 355 may be coupled with the purge aperture 337 and a bottom end of the gas lumen 355 may be coupled with a backside gas source, which enables the backside gas source to deliver gas to an underside of a substrate via the gas lumen 355 and the purge aperture 337. By supporting the substrate on the top surfaces of mesas 331 and sealing band 333, a forced leakby path for a gas from the backside gas source is created. The backside gas source may introduce gas to the leakby path through the gas lumen 355 and purge aperture 337. The backside gas may be controlled with a differential pressure apparatus to maintain positive pressure and force a leakby from under the substrate across the bevel of the substrate. The pattern of the mesas 331 and the positioning of the gaps in the sealing band 333 may be used to diffuse the gas and to generate a uniform gas flow across the bevel. While conventional bevel purge systems use an inert gas, the present invention may use a reactive gas to provide backside protection. For example, a particular deposition process may use boron-containing and/or carbon-containing precursors to deposit a boron doped carbon film on a substrate. Suitable reactive gas choices for backside leakby bevel purge may include $O_2$, $NF_3$, Na), and/or other fluorine and/or oxygen-containing species. In some embodiments, the gas for the bevel purge may include any combination of inert gases (Ar, He, Na, etc.), oxygenating species, fluorinating species, and/or hydrogen. For example, $O_2$ will be more effective than an inert flow (such as argon or helium), as $O_2$ reacts with and consumes the carbon (or other) precursor near the substrate bevel, which precludes deposition at the bevel of the substrate. Similarly, fluorine removes boron, while an inert gas, such as argon, may be used to control dilution. $H_2$ may be used to cause some localized etching of carbon as the gas breaks down in a plasma. $H_2O$ may be used to cause some etching of boron-carbon films. An in-situ etching may occur if suitable conditions are established to break down the purge gas close to the bevel. For example, radical deposition precursor effluents may react with the oxygen, which may consume the deposition effluents and limit or prevent deposition at the bevel.

In operation, a substrate may be in at least partial contact with the substrate platform 327 of the electrostatic chuck body and is supported by the mesas 331 and/or sealing band 333. This may produce a contact gap, which may essentially produce a capacitive effect between a surface of the pedestal and the substrate. Voltage may be applied to the contact gap, which may generate an electrostatic force for chucking. The power supply 340 may provide electric charge that migrates from the electrode to the substrate support surface where it may accumulate, and which may produce a charge layer having Coulomb attraction with opposite charges at the substrate, and which may electrostatically hold the substrate against the substrate platform 327 of the chuck body 325. This charge migration may occur by current flowing through a dielectric material of the chuck body 325 based on a finite resistance within the dielectric for Johnsen-Rahbek type chucking, which may be used in some embodiments of the present technology.

In some embodiments the electrostatic chuck body 325 and/or the stem 330 may be insulative or dielectric materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties as will be explained further below. Exemplary dopant materials may include yttrium, magnesium, silicon, iron, calcium, chromium, sodium, nickel, copper, zinc, or any number of other elements known to be incorporated within a ceramic or dielectric material.

Electrostatic chuck body 325 may also include an embedded heater 350 contained within the chuck body 325. Heater 350 may include a resistive heater or a fluid heater in embodiments. In some embodiments the electrode 335 may be operated as the heater, but by decoupling these operations, more individual control may be afforded, and extended heater coverage may be provided while limiting the region for plasma formation. Heater 350 may include a polymer heater bonded or coupled with the chuck body material, although a conductive element may be embedded within the electrostatic chuck body and configured to receive current, such as AC current, to heat the top puck. The current may be delivered through the stem 330 through a similar channel as the DC power discussed above. Heater 350 may be coupled with a power supply 365, which may provide current to a resistive heating element to facilitate heating of the associated chuck body 325 and/or substrate. Heater 350 may include multiple heaters in embodiments, and each heater may be associated with a zone of the chuck body, and thus exemplary chuck bodies may include a similar number or greater number of zones than heaters. The chucking mesh electrode 335 may be positioned between the heater 350 and the substrate platform 327 in some embodiments, and a distance may be maintained between the electrode within the chuck body 325 and the substrate platform 327 in some embodiments as will be described further below.

The heater 350 may be capable of adjusting temperatures across the electrostatic chuck body 325, as well as a substrate residing on the substrate platform 327. The heater may have a range of operating temperatures to heat the chuck body 325 and/or a substrate above or about 100° C., and the heater may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher. The heater may also be configured to operate in any range encompassed between any two of these stated numbers, or smaller ranges encompassed within any of these ranges. In some embodiments, as will be described further below, the chuck heater may be operated to maintain a substrate temperature above at least 500° C. during deposition operations, such as forming stacks of material for memory devices as previously described.

Figure 4:
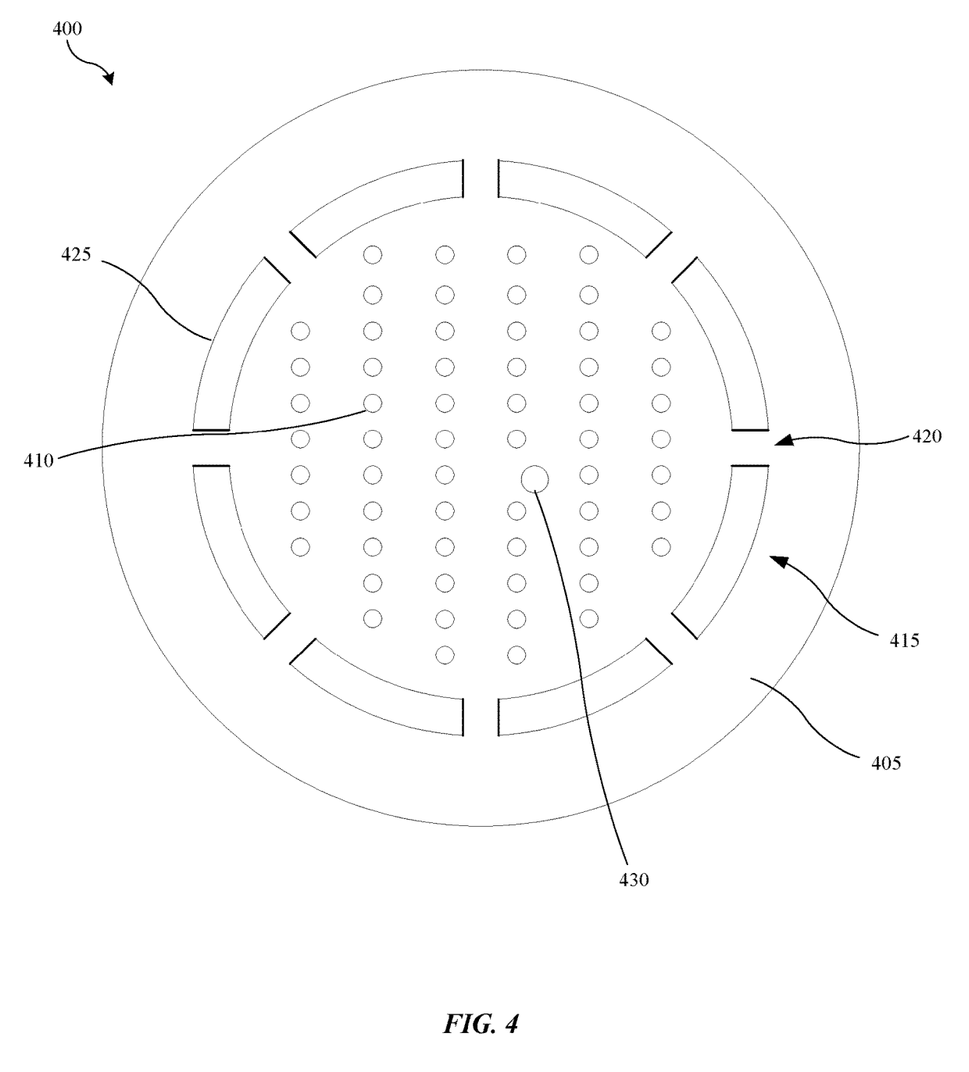
FIG. 4 shows a schematic top plan view of an exemplary substrate platform according to some embodiments of the present technology.

FIG. 4 shows a schematic top plan view of an exemplary substrate platform 400 according to some embodiments of the present technology. Substrate platform 400 may include any of the materials or components previously described, and may illustrate additional details of substrate platforms previously discussed. As illustrated, substrate platform 400 may have an upper surface 405 having an inner region. A number of mesas 410 may be disposed within and protrude upward from the inner region of the upper surface 405. As illustrated, the mesas 410 may be arranged in an array of columns and rows within the inner region. However, other embodiments may utilize other arrangements of mesa 410. For example, the mesas 410 may be arranged in a number of concentric annular rings from a center of the upper surface 405 towards an outer periphery of the inner region. Additionally, while shown with mesas 410 being positioned at regular intervals, some embodiments may utilize irregular arrangements of mesas 410. Mesas 410 may have circular cross-sections as shown, or any other geometric shape.

For example, the present technology may form mesas 410 characterized by a diameter or width of about 1 mm, about 2 mm, or more, and may in some embodiments include a combination of mesas 410 characterized by a diameter of greater than or about 1 mm and mesas 410 characterized by a diameter of greater than or about 2 mm. The mesas 410 may be characterized by any number of geometries and profiles in embodiments of the present technology. For an exemplary substrate platform 400, the substrate platform 400 may define greater than or about 250 mesas 410, and may define greater than or about 500 mesas 410, greater than or about 750 mesas 410, greater than or about 1,000 mesas 410, greater than or about 1,250 mesas 410, greater than or about 1,500 mesas 410, greater than or about 1,750 mesas 410, greater than or about 2,000 mesas 410, or more. The mesas 410 may be defined in any number of formations or patterns, including uniform patterns as well as general distributions across the surface.

By producing mesas 410 according to some embodiments of the present technology, a percentage of contact along a surface of a substrate may be increased to greater than or about 1.0%, and may be greater than or about 1.5%, greater than or about 2.0%, greater than or about 2.5%, greater than or about 3.0%, greater than or about 3.5%, greater than or about 4.0%, greater than or about 4.5%, greater than or about 5.0%, or greater. The percentage of contact may be maintained below or about 10% to limit leakage current below the previously stated ranges, and may limit contact below or about 8%, below or about 6%, below or about 5%, or less. When not including an amount of contact along ledge 420, the percentage contact provided by the mesas 410 may be maintained greater than or about 0.2% of the surface area of the substrate surface along the substrate platform 400. In some embodiments the percentage contact provided by the mesas 410 excluding a contribution of a sealing band may be maintained at greater than or about 0.3%, greater than or about 0.4%, greater than or about 0.6%, greater than or about 0.8%, greater than or about 1.0%, greater than or about 1.2%, greater than or about 1.4%, greater than or about 1.6%, greater than or about 1.8%, greater than or about 2.0%, greater than or about 2.2%, greater than or about 2.4%, greater than or about 2.6%, greater than or about 2.8%, greater than or about 3.0%, or greater. By providing substrate platforms 400 characterized by controlled leakage currents, the present technology may provide an increased chucking window that may suitably chuck substrates characterized by increased film stresses, while limiting or preventing arcing within a plasma environment.

A sealing band 415 may extend upward from the upper surface 405. The sealing band 415 may be disposed in a circumferential pattern and may define an outer boundary of the inner region. The sealing band 415 may at least partially encircle the mesas 410. The sealing band 415 may be sized and positioned to support a peripheral edge of a substrate, with an outermost edge of the sealing band 415 extending beyond the peripheral edge of the substrate. For example, for a substrate with a 150 mm radius, the outermost edge of the sealing band 415 may be positioned greater than 150 mm from a center of the substrate platform 400, such as about 151-155 mm. In some embodiments, the sealing band 415 may be sized and positioned to support the substrate with the peripheral edge of the substrate being positioned approximately halfway through a width of the sealing band 415. The sealing band 415 defines a number of gaps 420 at various points that serve as leakby channels for the backside gas. Thus, the sealing band 415 is characterized by a number of protruding segments 425 that define a support seat for an outer periphery of the substrate, with adjacent segments 425 being separated by one of the gaps 420. The gaps 420 may be provided at regular intervals about the sealing band 415. For example, as illustrated, gaps 420 are provided at every 45° along the circumference of the sealing band 415. It will be appreciated that other angular arrangements of gaps 420 may be produced, including at irregular intervals. The segments 425 may be larger than the gaps 420 as illustrated, however other sizes and/or numbers of segments 425 and gaps 420 are possible. For example, the segments 425 and gaps 420 may be approximately the same size. Additionally, while illustrated with eight segments 425 and eight gaps 420, a lesser or greater number of segments 425 and gaps 420 may be used in various embodiments.

The substrate platform 400 may further define a purge aperture 430 within the inner region of the upper surface 405. The purge aperture 430 may extend entirely through a thickness of the substrate platform 400 and may couple with a backside gas source to deliver gas to a backside of a substrate that is supported atop the mesas 410 and the sealing band 415. The purge aperture 430 may be disposed in spaces formed between the various mesas 410 without disrupting the pattern of mesas 410, or may be positioned to replace one or more of the mesas 410. For example, as illustrated a central mesa position has no mesa and instead provides space for the purge aperture 430 to extend through the substrate platform 400.

Figure 5:
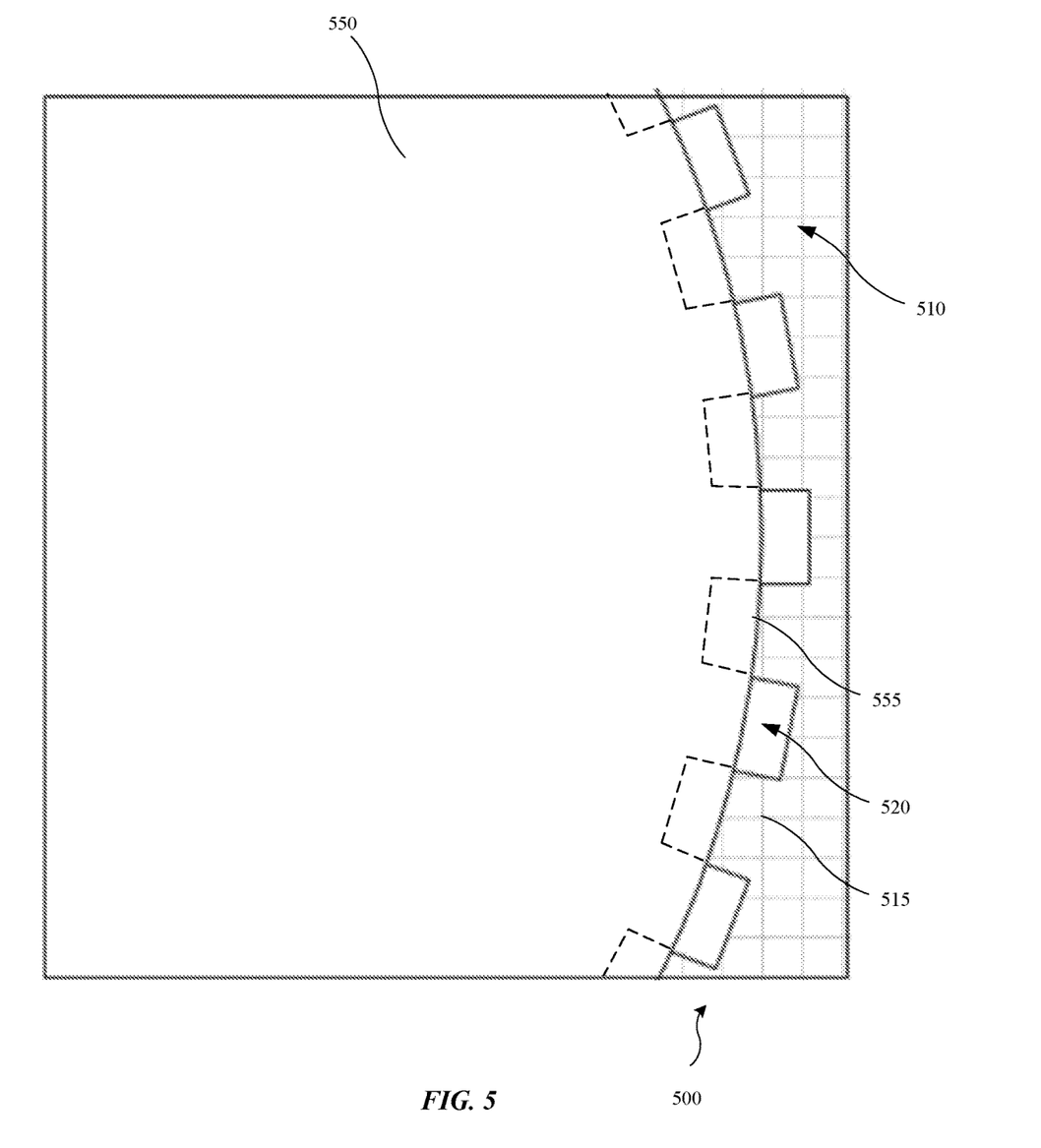
FIG. 5 shows a schematic partial top plan view of an exemplary substrate platform according to some embodiments of the present technology.

FIG. 5 shows a schematic partial top plan view of an exemplary substrate platform 500 supporting a substrate 550 according to some embodiments of the present technology. Substrate platform 500 may include any of the materials or components previously described, and may illustrate additional details of substrate platforms previously discussed. For example, the support platform 500 may have an upper surface that defines a purge aperture and that includes an array of mesas distributed about the upper surface as previously discussed. A sealing band 510 may be provided radially outward of the mesas. Sealing band 510 may extend entirely about a peripheral edge 555 of the substrate 550. Sealing band 510 may include a number of protruding segments 515 that protrude into an interior of the sealing band 510 and may be separated by a number of gaps 520. The alternating segments 515 and gaps 520 form a sawtooth pattern about an inner boundary of the sealing band 510 and provide a support surface on which the peripheral edge 555 of the substrate 550 is positioned. As illustrated, each segment 515 and each gap 520 may be approximately the same size and may be arranged at regular angular intervals. However it will be appreciated that segments 515 and gaps 520 may have different sizes than one another.

The substrate 550 may be positioned atop the substrate platform 500, with a peripheral edge 555 of the substrate 550 being supported atop the sealing band 510. For example, the peripheral edge 555 of the substrate 550 may be positioned on a medial portion of the sealing band 510, with at least a portion of each segment 515 and each gap 520 of the sealing band 510 extending beyond the peripheral edge of the substrate 550. This allows the gaps 520 to serve as leakby channels that enable purge gas to flow through the gaps 520 and past the peripheral edge 555 of the substrate 550 to reduce deposition at the bevel.

Figure 6A:
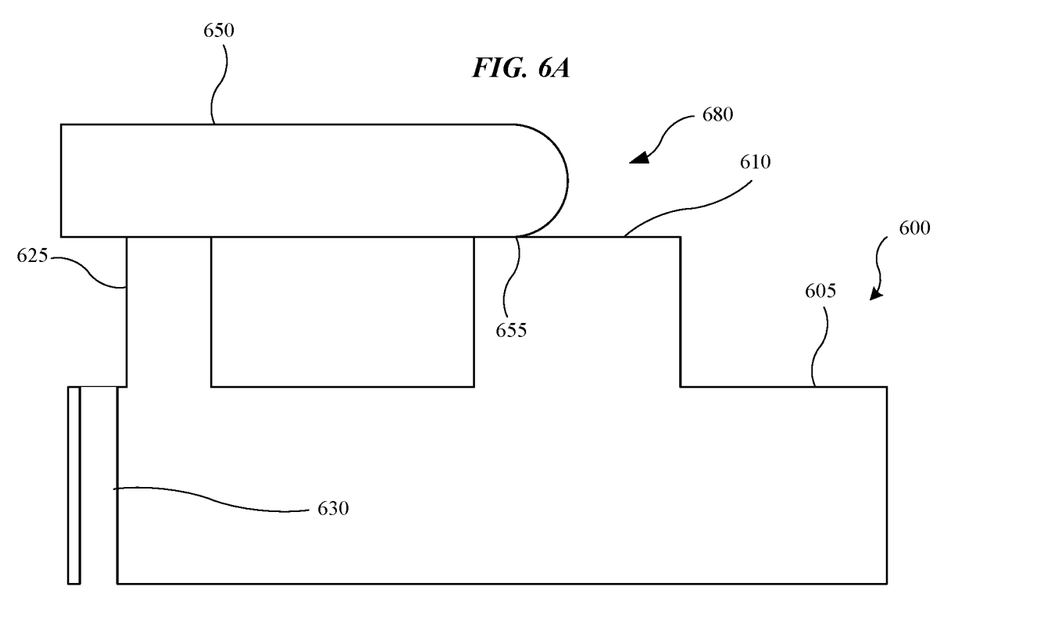
FIG. 6A shows a schematic partial side elevation view of an exemplary substrate platform supporting a substrate according to some embodiments of the present technology.
Figure 6B:
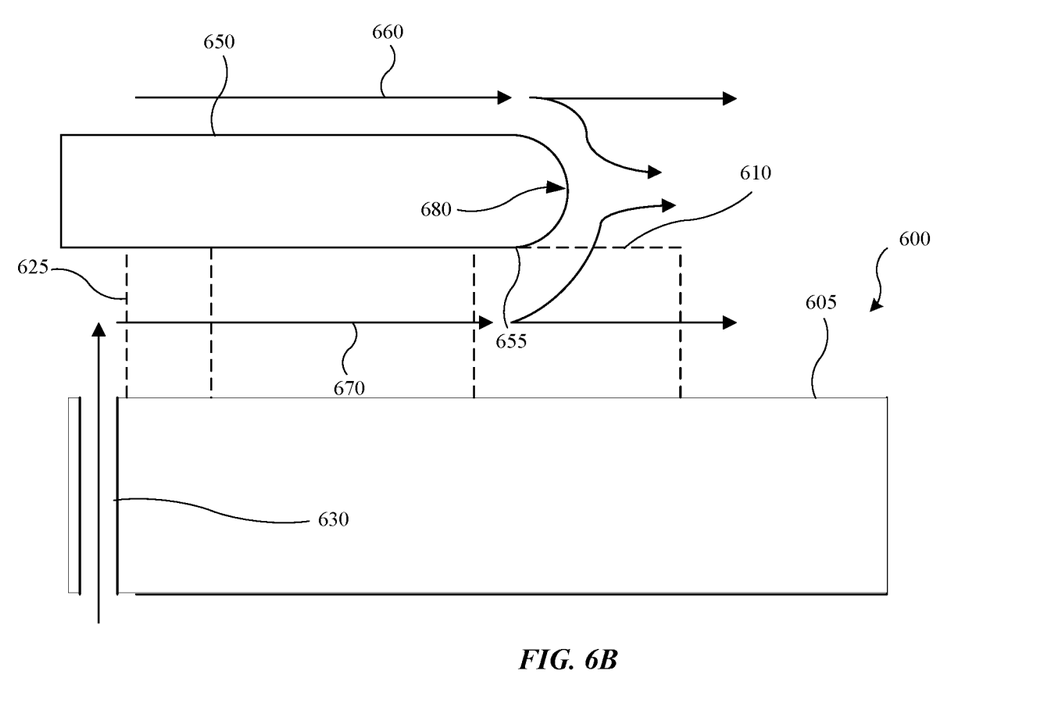
FIG. 6B shows a schematic partial side elevation view of a gas flow path for eliminating bevel deposition using an exemplary substrate platform supporting a substrate according to some embodiments of the present technology.

FIG. 6A is a partial cross-sectional side view of an exemplary substrate platform 600 supporting a substrate 650 according to some embodiments of the present technology. Substrate platform 600 may include any of the materials or components previously described, and may illustrate additional details of substrate platforms previously discussed. For example, the support platform 600 may have an upper surface 605 that defines a purge aperture 630 and that includes an array of mesas 625 distributed about the upper surface 605 as previously discussed. Each of the mesas 625 may contact a medial portion of the substrate 650. A sealing band 610 may be provided radially outward of the mesas 625. The substrate 650 may be positioned atop the substrate platform 500, with the peripheral edge 655 of the substrate 650 being supported atop the sealing band 610. FIG. 6B is a partial cross-sectional side view illustrating a gas flow path for eliminating bevel deposition using the substrate platform 600 according to some embodiments of the present technology. For example, a deposition gas, such as for a hardmask procedure, may be supplied by a gasbox and flowed across a top surface of the substrate 650. The gas may flow outward toward a bevel 680 of the substrate 650 as shown by arrows 660. For example, a particular deposition process may use $B_2H_6$ and $C_3H_6$ to deposit a boron doped carbon film on the substrate 650. A reactive backside gas may be flowed to an underside of the substrate 650. The backside gas may flow outward past the mesas 625 and toward the sealing band 610 as shown by arrows 670. The backside gas may flow through leakby channels formed by the gaps between segments of the sealing band 610, which may then flow upward and meet the deposition gas at a position proximate the bevel 680 of the substrate 650. As the backside gas, such as $O_2$, mixes with the deposition gas at the bevel 680, the reactive gas reacts with and consumes the radical carbon (or other) precursor near the substrate bevel 680, which precludes deposition at the bevel 680 of the substrate 650.

Figure 7:
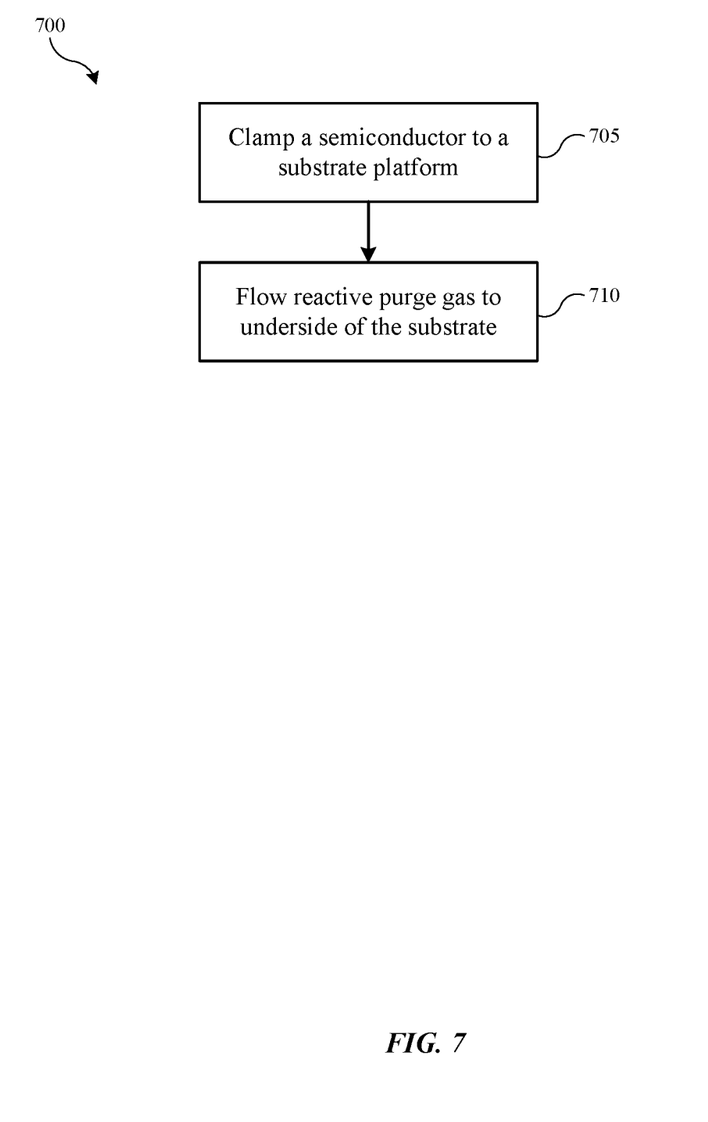
FIG. 7 is a flowchart of an exemplary method of semiconductor processing according to some embodiments of the present technology.

FIG. 7 shows operations of an exemplary method 700 of semiconductor processing according to some embodiments of the present technology. The method 700 may be performed in a variety of processing chambers, including processing system 200 described above, which may include substrate platforms according to embodiments of the present technology, such as substrate platforms 300, 400, 500, and 600. Method 700 may include a number of optional operations, which may or may not be specifically associated with some embodiments of methods according to the present technology.

Method 700 may include a processing method that may include operations for forming a hardmask film or other deposition operations. The method may include optional operations prior to initiation of method 700, or the method may include additional operations. For example, method 700 may include operations performed in different orders than illustrated. In some embodiments, method 700 may include clamping a semiconductor substrate to a support surface of a substrate platform using a chucking voltage at operation 705. For example, a semiconductor substrate may be positioned atop a number of mesas, with a peripheral edge of the semiconductor substrate being supported by a sealing band as described in FIGS. 5, 6A, and 6B. At least a portion of each gap and of each protruding segment of the sealing band may extend beyond an outer periphery of the semiconductor substrate. The sealing band may be characterized by a number of a number of protruding segments that are separated by gaps, similar to sealing bands 333, 415, 510, and/or 610 described above. The method 700 may include flowing a reactive purge gas to an underside of the semiconductor substrate and through the number of gaps at operation 710. The reactive purge gas, such as $O_2$, may mix with a deposition gas flowing from a top of the semiconductor substrate at the bevel, and which may be dissociated in a plasma generated in the chamber processing region. The reactive gas then reacts with and consumes the deposition gas near the substrate bevel, such as by producing carbon dioxide or other volatile materials which may be exhausted from the chamber, and which limits or precludes deposition at the bevel of the substrate 650.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A substrate support assembly, comprising:
an electrostatic chuck body defining a substrate platform, wherein:
the substrate platform is characterized by an upper surface, the substrate platform defining a purge aperture; and
the substrate platform comprises:
a plurality of mesas that are disposed in an inner region of the upper surface, wherein each of the plurality of mesas protrudes upward from the upper surface; and a sealing band that extends upward from the upper surface in a circumferential pattern and partially encircles the inner region of the upper surface, wherein:
   top surfaces of the plurality of mesas and the sealing band form a support surface for a substrate;
   the sealing band defines a number of gaps;
   the sealing band is characterized by a plurality of protruding segments that define a support seat for an outer periphery of a substrate, wherein adjacent pairs of the plurality of protruding segments are separated by a respective one of the number of gaps; and
   a size of each of the plurality of segments and a size of each of the number of gaps are substantially equal;
a support stem coupled with the electrostatic chuck body;
a heater embedded within the electrostatic chuck body; and
a backside gas source that is coupled with the purge aperture of the support surface.

2. The substrate support assembly of claim 1, wherein: the top surfaces of the plurality of mesas and the sealing band are the same height.

3. The substrate support assembly of claim 1, wherein: the gaps are provided at regular angular intervals about the sealing band.

4. The substrate support assembly of claim 1, wherein: the support stem defines a fluid lumen that extends between and couples the backside gas source and the aperture.

5. The substrate support assembly of claim 1, wherein: the plurality of mesas are uniformly arranged about the inner region of the upper surface.

6. The substrate support assembly of claim 1, wherein: the sealing band is positioned on the substrate platform so as to define a support seat for an outer periphery of a substrate; and
a portion of the sealing band and a portion of each gap extends radially outward from an outermost edge of the support seat.

7. The substrate support assembly of claim 1, wherein: the sealing band is characterized by a generally circular shape that is interrupted by the number of gaps.

8. The substrate support assembly of claim 1, wherein: the backside gas source delivers a reactive purge gas.

9. The substrate support assembly of claim 8, wherein: the reactive purge gas comprises $O_2$.

10. The substrate support assembly of claim 1, wherein: a peripheral edge of the sealing band and a portion of each of the number of gaps extend radially outward of a peripheral edge of a substrate seated on the sealing band.

11. A substrate support assembly, comprising:
electrostatic chuck body defining a substrate platform, wherein:
   the substrate platform is characterized by an upper surface, the substrate platform defining a single purge aperture; and
   the substrate platform comprises:
      a plurality of mesas that are disposed in an inner region of the upper surface, wherein each of the plurality of mesas protrudes upward from the upper surface; and
      a sealing band that extends upward from the upper surface in a circumferential pattern and partially encircles the inner region of the upper surface, wherein:
         the sealing band is characterized by a plurality of protruding segments that define a support seat for an outer periphery of a substrate;
         adjacent pairs of the plurality of protruding segments are separated by one of a plurality of gaps; and
         a size of each of the plurality of segments and a size of each of the plurality of gaps are substantially equal;
   a support stem coupled with the electrostatic chuck body; and
a backside gas source that is coupled with the purge aperture of the support surface.

12. The substrate support assembly of claim 11, wherein: the gaps are provided at regular angular intervals about the sealing band.

13. The substrate support assembly of claim 11, wherein: the support stem defines a fluid lumen that extends between and couples the backside gas source and the aperture.

14. The substrate support assembly of claim 11, wherein: the plurality of mesas are uniformly arranged about the inner region of the upper surface.

15. The substrate support assembly of claim 11, wherein: the backside gas source delivers a reactive purge gas.

16. The substrate support assembly of claim 11, wherein: a peripheral edge of the sealing band and a portion of each of the plurality of gaps extend radially outward of a peripheral edge of a substrate seated on the sealing band.

17. A method of processing a semiconductor substrate, comprising:
clamping a semiconductor substrate to a support surface of a substrate platform using a chucking voltage, wherein:
   the substrate platform is characterized by an upper surface and defines a single purge aperture; and
   the substrate platform comprises:
      a plurality of mesas that are disposed in an inner region of the upper surface, wherein each of the plurality of mesas protrudes upward from the upper surface; and
      a sealing band that extends upward from the upper surface in a circumferential pattern and partially encircles the inner region of the upper surface, wherein:
         the support surface is formed from top surfaces of the plurality of mesas and the sealing band;
         the sealing band defines a number of gaps separating a number of protruding segments; and
         a size of each of the number of protruding segments and a size of each of the number of gaps are substantially equal; and
flowing a reactive purge gas to an underside of the semiconductor substrate and through the number of gaps.

18. The method of processing a semiconductor substrate of claim 17, wherein:
the reactive purge gas comprises 02.

19. The method of processing a semiconductor substrate of claim 17, wherein:

at least a portion of each gap and each protruding segment of the sealing band extends outward beyond an outer periphery of the semiconductor substrate.

20. The method of processing a semiconductor substrate of claim 17, wherein:
a peripheral edge of the sealing band and a portion of each of the number of gaps extend radially outward of a peripheral edge of the semiconductor substrate.

* * * * *

UNITED STATES PATENT AND TRADEMARK OFFICE
CERTIFICATE OF CORRECTION

PATENT NO. : 11,495,483 B2
APPLICATION NO. : 17/071595
DATED : November 8, 2022
INVENTOR(S) : Venkata Sharat Chandra Parimi and Diwakar Kedlaya It is certified that error appears in the above-identified patent and that said Letters Patent is hereby corrected as shown below:

In the Claims

Column 16, Line 65, Claim 18: delete "02." and insert -- O2. --.

Signed and Sealed this
Twenty-second Day of October, 2024

Katherine Kelly Vidal
*Director of the United States Patent and Trademark Office*